Figure 1:
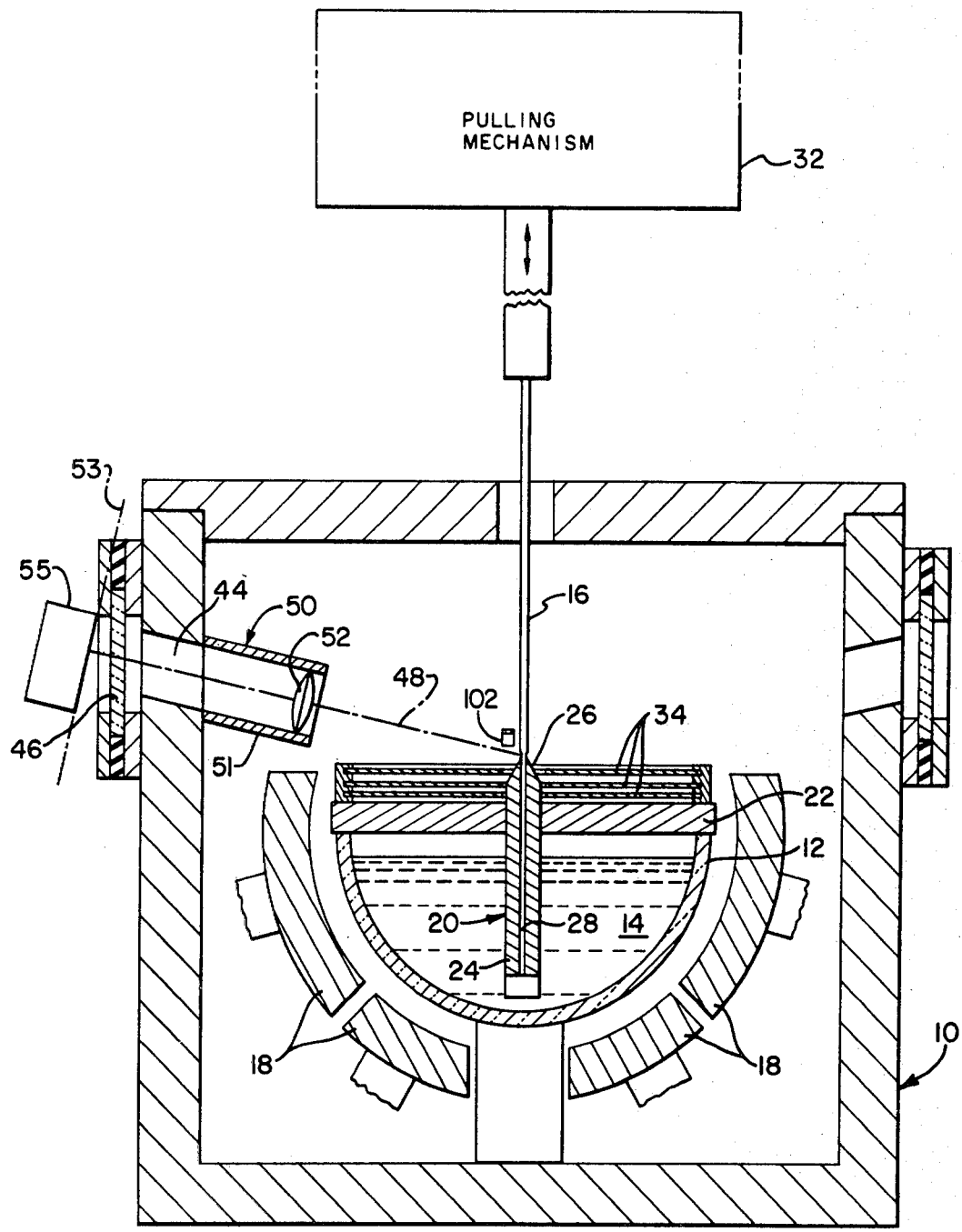

United States Patent [19]

Yates et al.

[11] 4,290,835
[45] Sep. 22, 1981

[54] METHOD FOR CRYSTAL GROWTH CONTROL

[75] Inventors: Douglas A. Yates, Burlington; Arthur E. Hatch, Waltham; Jeff M. Goldsmith, Medford, all of Mass.

[73] Assignee: Mobil Tyco Solar Energy Corporation, Waltham, Mass.

[21] Appl. No.: 161,037

[22] Filed: Jun. 19, 1980

Related U.S. Application Data

[62] Division of Ser. No. 915,443, Jun. 14, 1978.

[51] Int. Cl.$^3$ ............................................. C30B 15/26
[52] U.S. Cl. .................................................... 156/601
[58] Field of Search .................... 422/110, 105, 249; 156/617 SP, 601; 356/445, 448; 364/472, 500

[56] References Cited

U.S. PATENT DOCUMENTS

| | | | |
|---|---|---|---|
| 3,291,650 | 12/1966 | Dohmen et al. | 156/601 |
| 3,493,770 | 2/1970 | Dessaver et al. | 156/601 |
| 3,692,499 | 9/1972 | Andrychuk | 156/601 |
| 3,740,563 | 6/1973 | Reichard | 156/601 |
| 3,882,319 | 5/1975 | Clement et al. | 156/601 |
| 3,958,129 | 5/1976 | Clement et al. | 156/601 |
| 3,998,598 | 12/1976 | Bonora | 156/601 |
| 4,184,907 | 1/1980 | Yates | 156/601 |
| 4,185,076 | 1/1980 | Hatch et al. | 156/601 |
| 4,207,293 | 6/1980 | Scholl et al. | 156/601 |

FOREIGN PATENT DOCUMENTS 50-7556 3/1975 Japan ................................. 156/601

*Primary Examiner*—Hiram Bernstein
*Attorney, Agent, or Firm*—Schiller & Pandiscio

[57] ABSTRACT

The growth of a crystalline body of a selected material is controlled so that the body has a selected cross-sectional shape. The apparatus is of the type which includes the structure normally employed in known capillary die devices as well as means for observing at least the portion of the surfaces of the growing crystalline body and the meniscus (of melt material from which the body is being pulled) including the solid/liquid/vapor junction in a direction substantially perpendicular to the meniscus surface formed at the junction when the growth of the crystalline body is under steady state conditions. The cross-sectional size of the growing crystalline body can be controlled by determining which points exhibit a sharp change in the amount of reflected radiation of a preselected wavelength and controlling the speed at which the body is being pulled or the temperature of the growth pool of melt so as to maintain those points exhibiting a sharp change at a preselected spatial position relative to a predetermined reference position. The improvement comprises reference object means positioned near the solid/liquid/vapor junction and capable of being observed by the means for observing so as to define said reference position so that the problems associated with convection current jitter are overcome.

3 Claims, 7 Drawing Figures

METHOD FOR CRYSTAL GROWTH CONTROL

The Government has rights in this invention pursuant to Contract No. NAS7-100, JPL Subcontract 954355 awarded by the U.S. Department of Energy.

This application is a division of our copending application Ser. No. 915,443, filed June 14, 1978 for *Method and Apparatus for Crystal Growth Control.*

This invention pertains to the growth of crystalline bodies having a predetermined cross-section and more particularly to improvements in apparatus for and processes of growing such crystalline bodies.

Various processes are now known for growing crystalline bodies. One such process, hereinafter referred to as the "capillary die process," generally utilizes a capillary die or forming member from which the crystalline body can be grown. The process can be carried out in accordance with various techniques. By way of example, one such technique is described in U.S. Pat. No. 3,591,348 in which bodies are grown in accordance with the edge-defined film-fed growth technique (also known as the EFG Process). In this technique the cross-sectional shape of the crystalline body is determined, in part by the external or edge configuration of the top end surface of the capillary die member. The process involves the growth of a seed from a liquid film of feed material sandwiched between the growing body and the top end surface of the die member with the liquid in the film being continuously replenished from a suitable melt reservoir via one or more capillaries in the die member. By appropriately controlling the pulling speed of the growing body and the temperature of the liquid film, the flim can be made to spread (under the influence of the surface tension at its periphery) across the full expanse of the top end surface formed by the intersection of that surface with the side surface or surfaces of the die member. The growing body grows to the shape of the film which conforms to the edge configuration of the die member's top end surface. Since the liquid film has no way of discriminating between an outside edge and an inside edge of the die's top end surface, a continuous hole may be grown in the crystalline body by providing in that surface a blind hole the same shape as the hole desired in the body, provided, however that any such hole in the die member's top end surface is made large enough so that surface tension will not cause the film around the hole to fill in over the hole.

Another example of the capillary die process for growing crystalline bodies is described in U.S. Pat. No. 3,471,266. This technique employs a forming or die member that defines a capillary which contains a column of melt from which a crystalline body is grown and pulled. Depending upon the cross-sectional configuration of the capillary and by appropriate control of the thermal conditions in the upper end of the column of melt contained in the capillary, it is possible to grow crystalline bodies of selected material having arbitrary selected cross-sectional shapes. Thus, by employing a forming die member having a capillary in the shape of an annulus, it is possible to grow a hollow tube. The forming member is mounted so that the capillary is connected to a reservoir pool of melt, whereby the capillary is self-filling.

In capillary die processes, such as the two types described, changes in pulling speed and the temperature distribution, i.e., thermal gradients at the top end of the die member and in the melt near the solid/liquid growth interface (formed where the growing crystalline body joins the liquid film) can affect the cross-sectional size of the growing body. Since it is a relatively easy matter to hold the pulling speed constant, the usual practice, once the crystalline body is growing to the desired shape, is to fix the pulling speed at a suitable rate and to adjust the interface temperature gradients (by adjusting the rate of heating) so that the body will grow to the desired size.

Accordingly, it is desirable to monitor the growing body so as to keep the temperature gradients and the pulling speed within prescribed tolerance limits. Several monitoring systems and techniques are known. For example, a technique described in U.S. Pat. No. 3,870,477 issued to LaBelle is predicated upon the fact that capillary die processes of growing crystalline bodies are characterized by the presence of a meniscus of melt extending between an edge of the die member and the solid/liquid growth interface. The height of (and the degree of concavity) of the meniscus can change with changes in the operating conditions. More importantly, the height of the meniscus is affected by the temperature of the melt in the region of the solid/liquid growth interface and the pulling speed, and that the outer diameter of a hollow tube or solid rod or the thickness and width of a flat ribbon will decrease as the meniscus height increases (and an increase in the same diameter or width occurs if the outer meniscus height decreases).

A system described in U.S. copending application Ser. Nos. 778,577 and 778,589 (both filed Mar. 17, 1977 and assigned with the present application to a common assignee), now respectively U.S. Pat. Nos. 4,185,076 and 4,184,907, both issued on Jan. 22, 1980, monitors meniscus height by taking advantage of the discovery that during capillary die processes the meniscus joins the crystalline body at the solid/liquid/vapor junction (the junction formed at the intersection of the solid-liquid interface and the surrounding vapor) at a discernable meniscus angle. The term "meniscus angle," designated hereinafter as $\phi$, shall therefore mean the angle formed by the meniscus surface (the liquid/vapor interface) with the surface of the solid crystalline body (the solid/vapor interface) at the solid/liquid/ vapor junction. During the growth of a uniformly dimensioned crystalline body, i.e. during steady state conditions when the pulling speed of the crystalline body as well as temperature gradients near the solid/liquid growth interface are substantially constant, the surface of the crystalline body, i.e. the solid/vapor interface is parallel to the pulling axis. It has been found that for at least some materials, such as silicon and germanium, during these steady state conditions, the "steady-state meniscus angle" $\phi_o$ is substantially constant at some unique value depending upon the material (see Surek, T. and Chalmers, B; "The Direction of Growth of the Surface of a Crystal in Contact with Its Melt;" *Journal of Crystal Growth;* Volume 29, pp. 1–11 (1975)).

For silicon, for example, the steady state meniscus angle is $11° \pm 1°$, while for germanium approximately 8°. It has further been observed that, at least for silicon, the steady state meniscus angle will not be appreciably affected by variations of nearly two orders of magnitude in the crystal growth rate even though changes in meniscus height will occur.

The system described in U.S. copending application Ser. Nos. 778,577 and 778,589 now respectively U.S. Pat. Nos. 4,185,076 and 4,184,907; which utilizes meniscus height control accordingly comprises means for observing during a capillary die process at least a portion of the solid crystalline body and the meniscus including the solid/liquid/vapor junction, for quantities of radiation (at wavelengths to which the crystalline material is at least partially reflective) which are inherently provided within the growing apparatus due to the hot temperature atmosphere and reflected in a direction substantially perpendicular to the meniscus surface formed at the solid/liquid/vapor junction when steady state conditions exist. By determining the spatial position where a sharp change (or contrast) in the reflected radiation occurs, and referencing that position relative to some arbitrary reference spatial position (determined electronically by adjusting an input voltage potential level), the speed at which the crystalline body is pulled or the temperature of the growth pool of melt can be maintained so that the position exhibiting the sharp contrast can be controlled relative to the reference position. Although maximum contrast is achieved by observing the solid/liquid/vapor junction at an angle perpendicular to the surface of the meniscus at the junction, the meniscus height control technique can be accomplished by observing the surface at the junction at an angle which varies from the perpendicular so long as a discernable contrast arising from the reflected radiation from the meniscus and body surfaces exists.

Once steady state conditions are achieved, it is desirable to maintain the position of the solid/liquid/vapor junction relative to, for example, the top of the die member to within ±1 mil so as to maintain steady state growth conditions. Although the meniscus height control systems are sensitive enough to provide such control, it has been found that, at least in some furnaces for growing crystalline bodies, heat convection currents between the actual object being viewed and the sensing instrument can produce "convection current jitter". The latter produces shifts in the image received by the instrument due to changes in the index of refraction produced by the convection currents when, in fact, no shift in the solid/liquid/vapor junction has occured. Thus, false adjustments will result in the paramater or parameters being controlled by the instrument.

Accordingly, it is an object of the present invention to provide an improved apparatus for and method of monitoring and controlling crystal growth so that the cross-sectional dimensions of the growing body is within prescribed limits.

Another object of the present invention is to provide an improved apparatus for and method of automatically monitoring and controlling the growth of crystalline bodies, such as silicon, so that the cross-sectional dimensions of the growing body are substantially constant.

A further object of the present invention is to provide an improved apparatus for and method of controlling and monitoring growth of crystalline bodies which includes all of the advantages of the meniscus height control system and technique disclosed in U.S. copending application Ser. Nos. 778,577 and 778,589, now respectively U.S. Pat. Nos. 4,185,076 and 4,184,907 and described hereinafter.

And yet another object of the present invention is to provide an improved apparatus for and method of controlling and monitoring the growth of crystalline bodies in crystal-growing furnaces while avoiding the above-noted problems associated with convection current jitter.

The foregoing and other objects of the present invention are achieved by improved crystal growing apparatus of the type described in copending application Ser. Nos. 778,577 and 778,589, now respectively U.S. Pat. Nos. 4,185,076 and 4,184,907 which employs a capillary die process and comprises means for observing at least a portion of the solid crystalline body and the meniscus including the solid/liquid/vapor junction, for quantities of radiation (at wavelengths to which the crystalline material is at least partially reflective) reflected in a direction substantially perpendicular to the meniscus surface formed at the solid/liquid/vapor junction when steady state conditions exist. The spatial position where a sharp change (or contrast) in the reflected radiation occurs is determined and this spatial position is referenced relative to some reference spatial position so that the speed at which the crystalline body is pulled or the temperature of the growth pool of melt is maintained is controlled so that the position exhibiting the sharp contrast can be controlled relative to the reference position. The improvement comprises reference object means fixed in space, near the solid/liquid/vapor junction for defining the reference position so that said means for observing also observes the reference object means and so that shifts in the image of said solid/liquid/vapor junction as seen by said means for observing, caused by conviction current jitter, will produce corresponding shifts in the image of said reference means.

Figure 2:
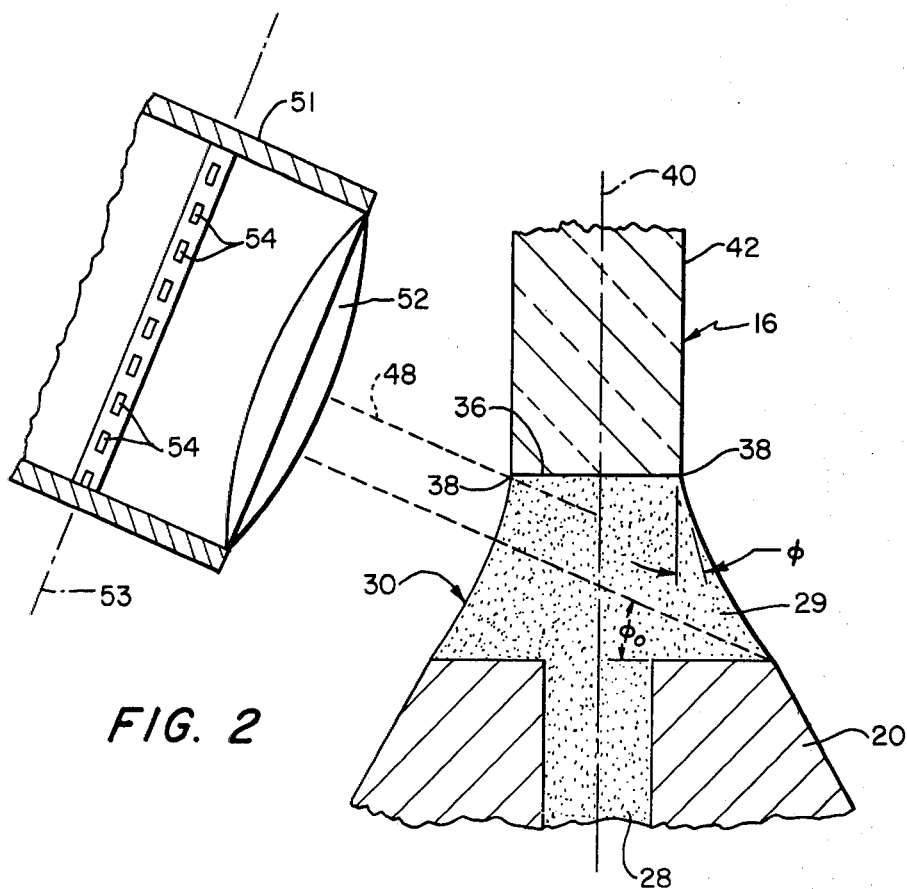
Figure 5:
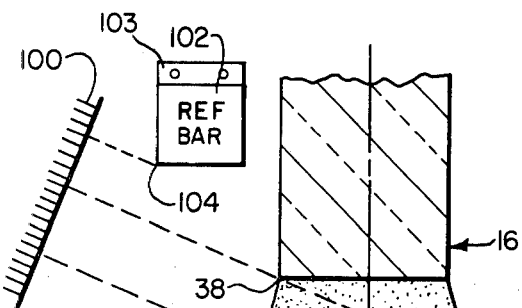
Figure 3:
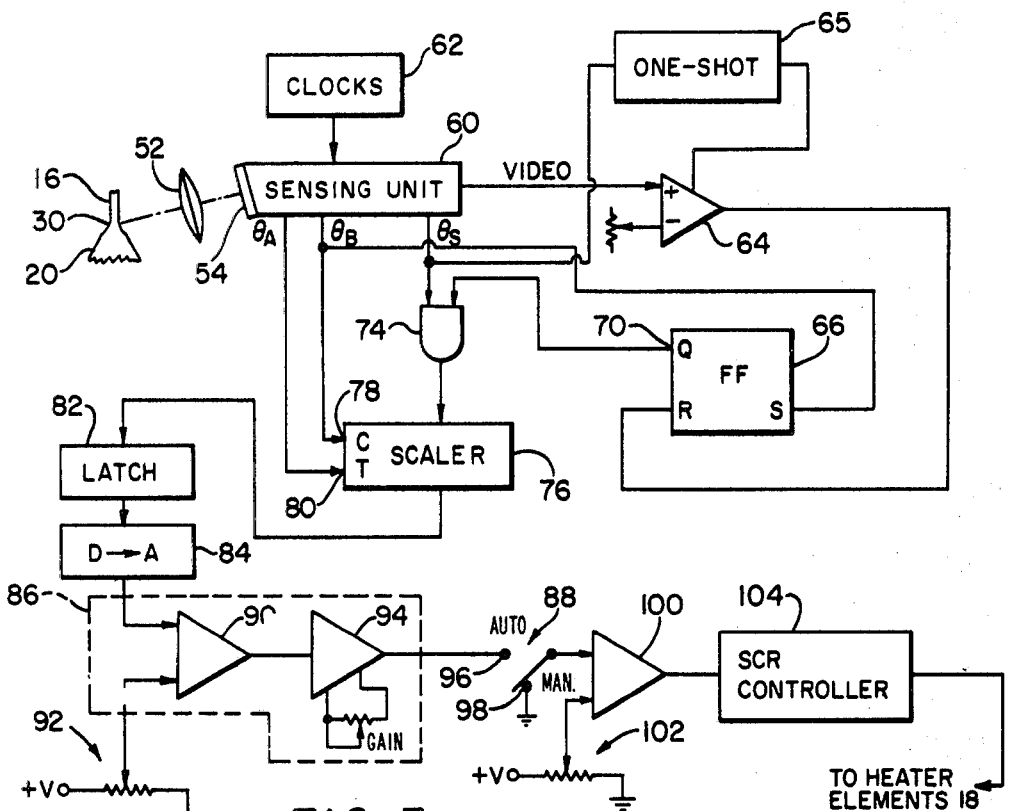
Figure 4:
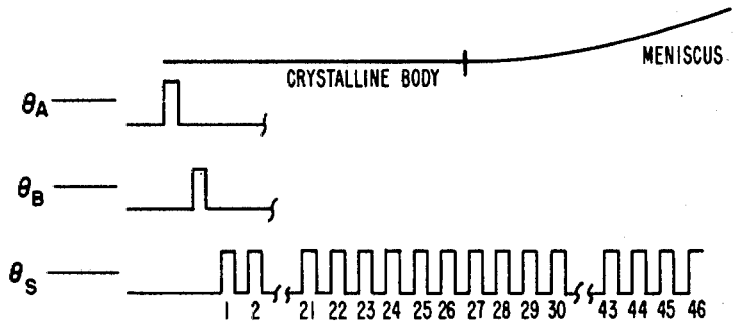
Figure 4:
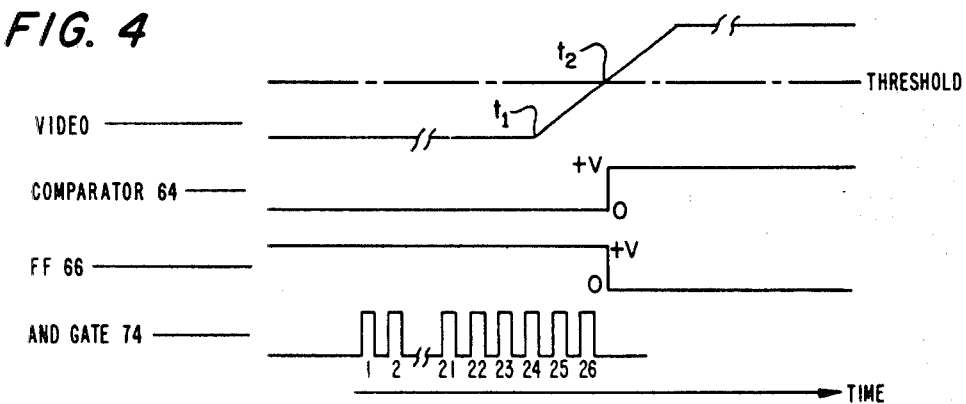
Figure 6:
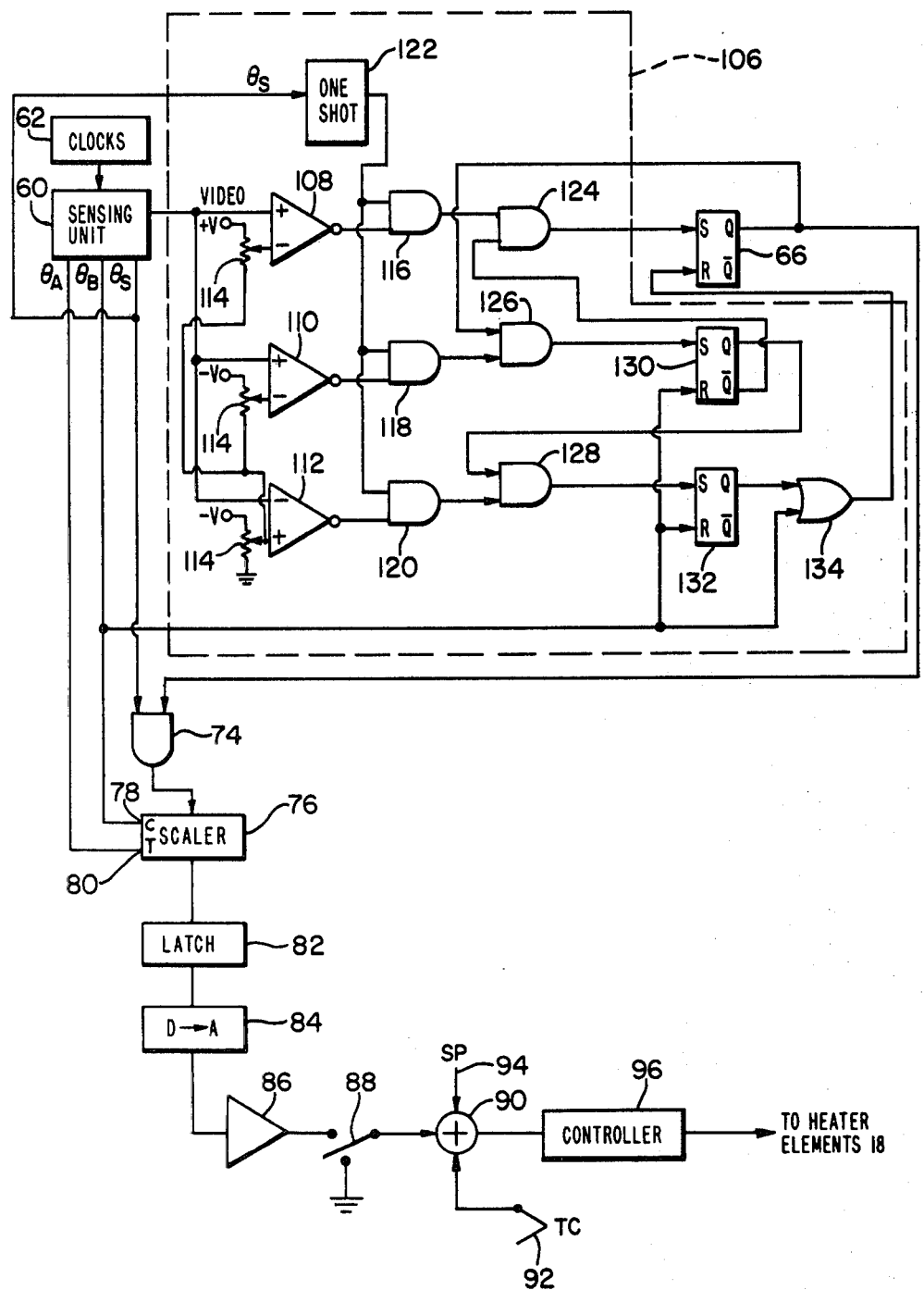
Figure 7:
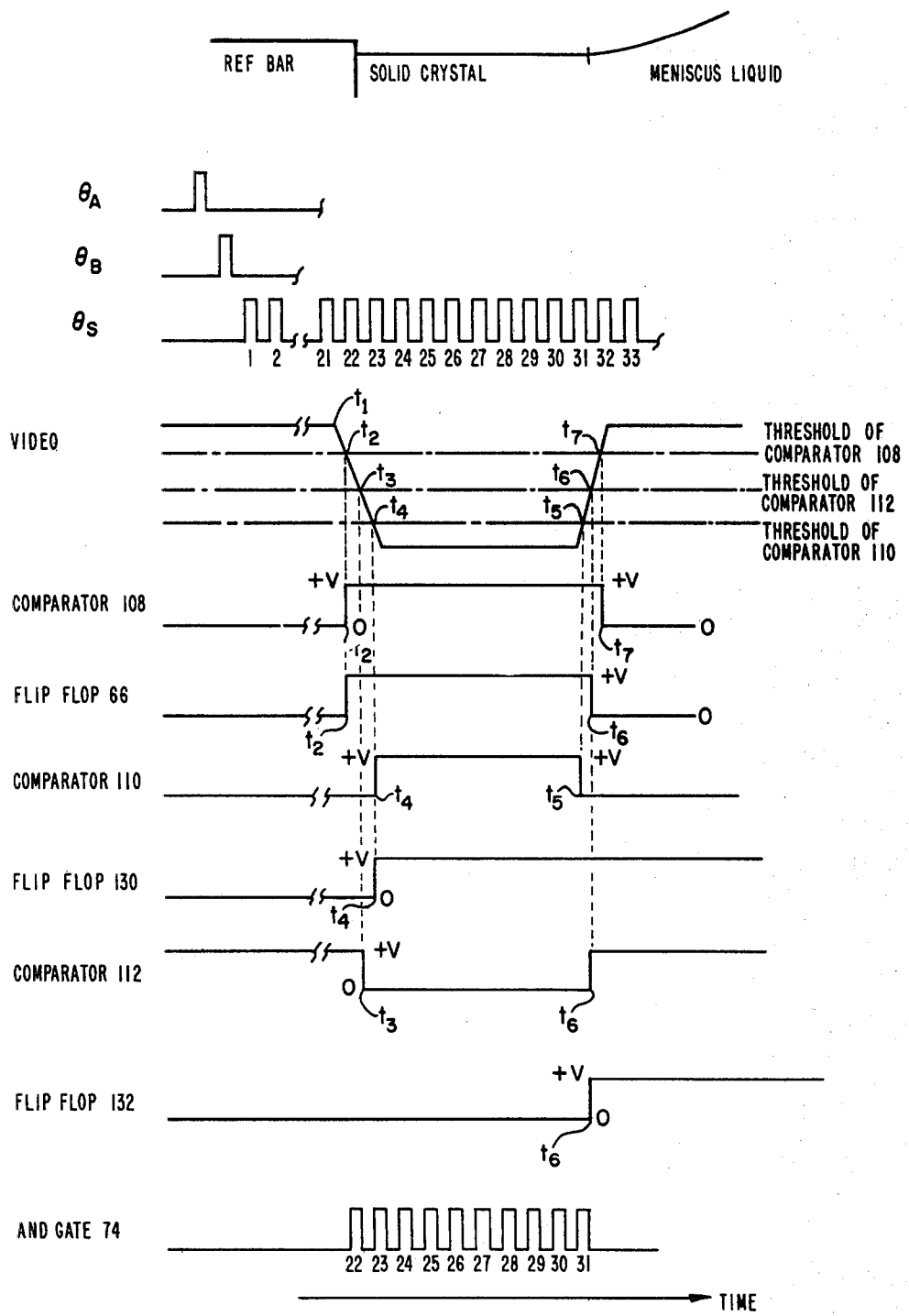

Other features and specific details of the present invention are set forth in the following description which is to be considered together with the drawings wherein:

FIG. 1 is a sectional view in elevation, of a crystal growing furnace, incorporating the present invention, with certain parts represented schematically, and illustrates the growth of a crystalline body according to a capillary die process;

FIG. 2 is a schematic view on an enlarged scale illustrating a portion of the apparatus shown and described in copending application Ser. Nos. 778,577 and 778,589, now respectively U.S. Pat. Nos. 4,185,076 and 4,184,907 as combined with the furnace of FIG. 1;

FIG. 3 is a schematic block diagram illustrating further aspects of the embodiment described in copending application 778,577 and 778,589, now respectively U.S. Pat. Nos. 4,185,076 and 4,184,907;

FIG. 4 is an exemplary timing diagram of the block diagram of FIG. 3;

FIG. 5 is a schematic view illustrating a portion of the apparatus described in copending application Ser. Nos. 778,577 and 778,589, now respectively U.S. Pat. Nos. 4,185,076 and 4,184,907 as modified in accordance with the present invention;

FIG. 6 is a schematic block diagram illustrating the modifications to the embodiment of FIG. 3 to incorporate the principles of the present invention; and FIG. 7 is an exemplary timing diagram of the block diagram of FIG. 6.

Like numerals are used to indicate like parts in the several figures.

Capillary die processes, of the character already described, are characterized by the presence of a vertical meniscus of melt extending between en edge of the die or forming member and the liquid/solid growth interface. It is generally known that the vertical height of the meniscus can change with changes in the operating conditions. When a change in meniscus height occurs the solid/liquid/vapor junction formed by the intersection of the liquid meniscus and solid crystalline body shifts its position relative to some fixed reference position such as the top of the die member. Since the vertical height of the meniscus is affected by the temperature of the melt in the region of the growth interface as well as the pulling speed, it necessarily follows that a shift in the vertical position of the solid/liquid/vapor junction relative to this fixed reference position indicates a change in operating conditions. Thus, the cross-sectional dimensions of the crystalline body will increase or decrease depending on whether the solid/liquid/vapor junction shifts toward or away from the fixed referenced position. As described in copending application Ser. Nos. 778,577 and 778,589, now respectively U.S. Pat. Nos. 4,185,076 and 4,184,907 where the crystalline material is at least partially reflective to preselected wavelengths of radiation, the cross-sectional dimensions of the crystalline body can be monitored and controlled by taking advantage of the fact that a unique steady state meniscus angle exists at the solid/liquid/vapor junction during steady state conditions.

More specifically, it may be observed that when viewing a flat surface along an axis substantially perpendicular to the surface through for example, a long tube, substantially all radiation reflected off the surface at an acute angle will not be seen and consequently the surface will appear dark (due to the apparent absence of the radiation). However, as the viewing angle changes with respect to the perpendicular, the dark spot seen through the long tube will lighten as a result of reflected radiation being directed along the viewing axis. It has been observed that this phenomenon will occur even when viewing a hot object since in addition to radiation emitted by the hot object, it may also reflect radiation emitted by other radiation emitting and reflecting objects which are in the immediate vicinity of the hot object.

As described in copending application Ser. Nos. 778,577 and 778,589, now respectively U.S. Pat. Nos. 4,185,076 and 4,184,907 by viewing at least a portion of the crystalline body and meniscus surfaces, including the solid/liquid/vapor junction, in a direction substantially perpendicular to the meniscus surface formed at the solid/liquid/vapor junction when steady state conditions exist, a sharp contrast or change in radiation intensity can be recognized at the solid/liquid/vapor junction. This contrast occurs since the viewing axis is perpendicular to the meniscus surface at the solid/liquid/vapor junction and thus substantially all radiation reflected off the meniscus at the junction will be reflected at an acute angle to the viewing axis and thus will not be seen. Conversely, the surface of the solid body will be at an angle, i.e. the meniscus angle, to the surface of the meniscus so that the viewing axis with respect to the surface of the body at the junction is less than 90°. For silicon, for example, during steady state growth this angle will be 79°±1°. Some reflected radiation, therefore, can be seen from the crystalline body providing a contrast between the two surfaces at the solid/liquid/vapor junction.

The above is best illustrated in connection with the drawings wherein FIG. 1 shows a crystal growing furnace 10 provided with a suitably supported crucible 12. The crucible contains a crystalline melt material 14 from which the crystalline body 16 is to be grown, the melt material being maintained at a predetermined temperature by one or more heater elements 18. A suitable capillary die or forming member 20 is supported by the plate 22 resting on the crucible so that one end 24 of the die member extends into the melt material 14 while the other end 26 of the die member extends above the plate 22. The capillary die member 20, as shown, is similar to the type of the die member employed in the EFG process previously mentioned and described in detail in U.S. Pat. No. 3,591,348. Generally, the cross-sectional shape of the crystalline body 16 is determined by the external or edge configuration of the upper end 26 of the die member 20. By way of example, the die may be designed for growing a thin flat ribbon, in which case FIG. 1 may be considered as presenting a side edge view of the die with the longer horizontal dimension of the ribbon, i.e., its width being perpendicular to the plane of the drawing. As shown more clearly in FIG. 2, the die member 20 includes at least one capillary 28 so that the liquid in the meniscus film 29 formed between the top of the die member 20 and the crystalline body 16 can be continuously replenished from the reservoir of melt material 14 as the body 16 is being pulled. The body 16 is pulled at a constant speed along a pulling axis by the pulling mechanism 32. In order to provide a more uniform temperature of the meniscus during steady state conditions, a plurality of thin radiation shields 34 are provided on the plate 22 around the die member 20 so as to help maintain a uniform temperature of the melt material 14.

As shown more clearly in FIG. 2, the meniscus 30 of film 29 intersects the body 16 at the solid/liquid interface 36, which in turn forms the solid/liquid/vapor junction 38. As previously described, during steady state conditions (when the body 16 is being pulled at a constant speed and the temperature of melt material is substantially constant) the solid/vapor interface 42, i.e. the surface of body 16, is parallel to the pulling axis 40. By extending the interface 42, the meniscus angle $\phi$ is formed with respect to the surface of the meniscus 30 at the junction 38 as shown.

In accordance with the disclosures of copending applications Ser. Nos. 778,577 and 778,589 now respectively U.S. Pat. Nos. 4,185,076 and 4,184,907; at least a portion of the body 16 and meniscus 30 including the solid/liquid/vapor junction 38 is viewed at an angle perpendicular to the surface of the meniscus formed at the junction during steady state conditions. Accordingly, the furnace 10 of FIG. 1 is provided with one or more viewing ports 44 provided with corresponding windows 46 and located so that portions of the body and meniscus can be viewed at this angle along the viewing axis 48. It will be appreciated that since the pulling axis 40 is vertical, the viewing axis is preferably oriented at the complement of the steady state meniscus angle $\phi_o$ with respect to the pulling axis. Thus, for furnaces where silicon is to be grown, each port 44 is located so that its viewing axis 48 intersects the meniscus at an approximate 11° angle with the horizontal or conversely at an approximate 79° angle with respect to the pulling axis. The line of demarcation thus formed by the sharp change in contrast at the solid/liquid/vapor junction 38 can be viewed with suitable means 50 provided at one or more of the ports 44 along the corresponding axis 48 to determine if the junction shifts relative to some fixed referenced position which, as described in copending applications 778,577 and 778,589, is electronically determined. When shifts occur, the speed at which the body 16 is being pulled or the temperature of the growth pool of melt 14 can be adjusted so that the line of demarcation indicating the solid/liquid/vapor junction 38 will return to its correct position.

As shown in FIG. 1 and more particularly in FIG. 2, the means 50 includes a lens 52 properly mounted in a cool tube 51 (the latter preferably is cooled by having a cooling fluid flowing therethrough) and positioned along viewing axis 48. It will be appreciated that alternatively lens 52 can be located outside of the furnace along the optical axis 48. Lens 52 forms an image of at least a portion of the body 16 and meniscus 30 in the image plane 53. The lens may be designed to provide any desired magnification of the image of the portion of the body 16 and meniscus 30 depending upon the resolution and accurancy of control desired. A lens having a magnification of 2 has been found satisfactory although a lens providing anywhere from 1 to 5 times magnification would be equally satisfactory. A monitoring and control system 55 is positioned with respect to the image plane 53 so that the position of the solid/liquid/vapor junction 38 can be observed and the growth of the crystalline body 16 can be controlled.

Referring to FIG. 2, system 55 preferably includes a plurality of radiation detectors 54 arranged in a linear array oriented in a direction perpendicular to the viewing axis 48 and coplanar with the image plane 53. Detectors 54 are each of a type which provides an electrical output signal, the magnitude of which is proportional to the amount of radiation, within a predetermined waveband, which is received by the detector. The waveband to which detectors 54 are sensitive includes radiation to which the body 16 and meniscus 30 are at least partially reflective. It will be appreciated therefore that the amount of reflected radiation within the wavebeand of reflected radiation that is necessary for the present invention to operate in dependent in part upon the sensitivity of detectors 54 and the reflectivity of the crystalline material at a particular wavelength. For example, silicon exhibits a high reflectivity, i.e., approximately 38%, at $0.5\mu$. By employing detectors which are sensitive to radiation at $0.5\mu$, the position of the junction 38 can be ascertained by observing the position of the discontinuous change in the amount of radiation at $0.5\mu$ received by the detectors. Such detectors are commercially available. For example, "linear-imaging devices" (LIDs) or "linear-imaging sensors" (LISs), such as, for example, the CCD-110 system from the Fairchild Camera Instrument Corporation of Mountain View Calif., can be used.

Referring to FIG. 3, the circuit is shown as including the CCD-110 system generally referred to as sensing unit 60. In addition to detectors 54, the sensing unit includes an analog shift register (not shown) for simultaneously storing the output values of the individual detectors, all of the latter sensing the radiation received at the same instant of time. The unit may include its own clocking circuitry or in the alternative clocks 62 may be provided as shown. Unit 60 provides four output signals from four corresponding output terminals. The first output signal is hereinafter designated the transfer pulse $\phi_A$. The second output is hereinafter designated the clearing or reset pulse $\phi_B$ and is provided subsequently to $\phi_A$. Both pulses are shown in the timing diagram of FIG. 4. After the second output pulse, the unit then provides a clock or strobe signal $\phi_s$ (which includes a series of pulses) and a video output signal, both shown in the timing diagram of FIG. 4. The video signal is essentially a series of pulsed analog signals representative of the outputs of the corresponding detectors stored in the analog shift register. However, the amplitude of the signal is negative in polarity (assuming no D.C. bias) and proportional to the intensity of the radiation detected by the particular detector. Thus, assuming no D.C. bias, the amplitude of the signal is zero in the absence of radiation and of a negative amplitude proportional to the intensity of radiation when such radiation is present. By way of example, as shown in FIG. 4, when the 21st clock pulse is provided the amplitude of the video signal corresponds to the amount of radiation detected by the 21st detector. Similarly, the amplitude of the video signal occuring during the time of the 22nd clock pulse correspnds to the amount of radiation detected by the 22nd detector. The video output of unit 60 is connected to the positive input of a comparator 64. The negative input of comparator 64 is connected to an adjustable DC voltage source. The latter provides the threshold level of the comparator. Generally, the output of comparator 64 is at a low or negative logic state so long as the voltage at the positive input is below the threshold voltage at its negative input. The output of comparator 64, however, changes to a high or positive logic state when the voltage at its positive input exceeds the reference voltage (threshold level) at its negative input. One-shot 65 having an input for receiving the clock signal $\theta_s$, has its output connected to the strobe input of comparator 64, so that the latter only compares the amplitude of each pulse signal of the video output with the reference voltage. The output of comparator 64 is connected to the clearing or reset input of a J-K flip-flop 66, with the set input of the latter being adapted to receive the $\theta_B$ output pulse from unit 60. Generally, flip-flop 66 operates so that its Q output 70 goes to a high logic state (positive voltage) when the $\theta_B$ pulse is received at its setting input. The Q output will remain high until the reset input receives a positive voltage pulse from the output of comparator 64, whereupon the Q output of the flip-flop will go to a low logic state (zero or some negative voltage) and remain in that state until the next $\theta_B$ pulse is received at the reset input. The Q output 70 of flip-flop 66 and the clocking output of unit 60 are connected to two inputs of AND gate 74. The latter will provide an output in a high logic state so long as its two inputs are high; otherwise the output is low. The output gate 74 is connected to the input of a scaler 76. The latter has its clearing input 78 and its transfer input 80 connected to receive, respectively, the clearing pulse $\theta_B$ and the transfer pulse $\theta_A$ from the unit 60. Scalers are generally well known in the art, and, for example, the scaler 76 may be a frequency counter providing a binary output. Generally, scaler 76 counts the number of pulses of the clock signal received from the output of gate 74 when the latter is enabled by the Q output of flip-flop 66. This number is jam transferred to latch 82 when the transfer pulse $\theta_A$ is received at the transfer input 80 of the scaler 76.

The latch 82 generally holds this signal provided from scaler 76 until an update is received from the scaler. Accordingly, latch 82 may be a register or similar device. The digital output of latch 82 is converted to an analog signal by the digital-to analog-converter 84. The analog output of converter 84 is signal conditioned by amplifier 86 to the switch 88. The contact arm of switch 88 is connected to the summing junction (not shown) of the controller 90. The controller is preferably of the type manufactured under the trademark ELECTROMAX III by Leeds and Northrup of North Wales, Pennsylvania through other controllers can be used. The summing junction of the controller 90 preferably sums the inputs from the output of amplifier 86, thermocouple 92, (the latter being positioned in crucible 12 or preferably near the end 26 of the die member 20 in order to measure the melt temperature to be controlled) and the input from a set point control 94. The output of controller 90 is connected to an SCR controller 96. The latter provides an output which is proportional to its input so as to provide a voltage suitable for controlling the heater elements 18 (shown in FIG. 1).

In operation, the means 50 is properly positioned with respect to port 44 so as to observe the meniscus 30 at the steady state meniscus angle along axis 48. Where silicon is being grown, axis 48 is oriented at 11° with respect to the horizontal, while germanium requires the axis to be oriented at about 8° with respect to the horizontal. As the crystal is growing, the monitoring system is designed to continually monitor and control the location of the solid/liquid interface 36 relative to some fixed position such as the top of the die member 20. Referring to the timing diagram of FIG. 4, the first pulse provided is the transfer pulse $\theta_A$. As will be more apparent hereinafter, the transfer pulse jam transfers the value in the scaler 76 from the previous scan into latch 82. The next pulse $\theta_B$ clears the scaler 76 for the next scan and resets flip-flop 66 so that the Q output 70 of the flip-flop goes high and gate 74 is enabled. As previously described, signals representative of the amount of radiation received by the detectors 54 are simultaneously stored in the analog shift register of sensing unit 60 and subsequently provided as the series of pulse analog video output signals. With the scaler 76 cleared, a clock pulse $\theta_S$ is provided for each video pulse shifted out of the analog shift register and provided at the video output of the unit 60. Each of these clock pulses is counted in the scaler so long as the AND gate 74 is enabled. The amplitude of the video signal is continually compared to the threshold level set at the negative input of comparator 64. Since some reflected radiation is received by the detectors positioned to receive radiation reflected from the crystalline body 16, the amplitude of the corresponding portion of the video signal will be below the threshold level so that the output of comparator 64 will remain zero, the Q output 70 will remain high, the gate 74 will remain enabled and the scaler 76 will continue counting the clock pulses.

A substantially reduced amount of reflected radiation is provided immediately below the junction 38 as a result of viewing along the viewing axis 48. The amplitude of the video signal of unit 60 therefore begins to rise. Although theoretically the amplitude of this signal should increase almost instantaneously, as a practical matter this generally does not occur. Instead as shown in FIG. 4, the amplitude increases over the next several pulses of the strobe signal (indicating a decrease in detected radiation) since (1) the lens 52 utilized can include optical defects such as chromatic aberrations, (2) reflections can occur within the optical system such as multiple internal reflections within the window 46, when the latter is placed within the optical system and (3) there is some radiation scattering from other sources which the detectors will sense as the reflected radiation of interest. Thus, by way of example, as shown in FIG. 4, the change occurs at t1 so that the amplitude of the video signal begins to change. When the amplitude of the video signal exceeds the threshold level at t2 the amplitude of the signal at the positive input of the comparator 64 will exceed the threshold level so that the output of the comparator will go from a zero or negative voltage to some positive voltage. The positive going transition of the voltage provided at the reset input of flip-flop 66 will cause the Q output 70 to go from a high to a low state disabling the AND gate 74. Once AND gate 74 is disabled, the scaler 76 will discontinue counting the strobe pulses. In the example shown in the timing diagram, this count will be 26 corresponding to the previous twenty-six strobe pulses. The video signal will continue until the entire analog shift register of sensing unit 60 is empty. It is noted that after the interface has been detected even if the amplitude of the video signal should fall below the threshold level of comparator 64, causing the output of the latter to go to a zero or negative value the Q output 70 of flip-flop 66 will remain low and the AND gate 74 will remain disabled.

At the end of the video signal (when the values representative of all the detectors have been provided) the transfer pulse $\theta_A$ is provided to the transfer input 80 of scaler 76 so as to jam transfer the value in binary form from scaler 76 to latch 82 (in the example of FIG. 4, this value being 26). The latch 82 will hold this value until the next scan (of the next set of readings sequentially provided from the analog register) is completed and an update is provided from the output of scaler 76. The value in latch 82 is a digital signal and applied to the input of the digital-to-analog converter 84. The analog output of converter 84 is conditioned and shaped by amplifier 86 and applied to the summing junction 90. If the solid/liquid/vapor junction 38 is in its proper position the output of the summing junction and thus the output of the controller 96 is such that the signal applied to the heating elements is substantially constant and the temperature of the melt material remains at the desired temperature as measured by the thermocouple 92. In order to properly set the voltage level of the output of amplifier 86 so that this remains true, the switch 88 is initially set to ground and the output of the amplifier 86 is manually offset to zero for ground level (by a potentiometer associated with amplifier 86) during steady state growth conditions. Thus, the output from the summing junction 90 will represent the sum of the signals from the thermocouple 92 and the set point 94. In order to vary the steady state temperatures of the melt temperature, the operator need only vary the setting of the set point 94 to provide a greater or lesser voltage to the heater elements during steady state conditions. The system continually repeats the scan of the values in the analog register and therefore periodically provides an update. Where a change in the number of pulses counted in scaler 76 occurs when AND gate 74 is disabled, the new value is jam transferred to latch 82, the analog output of converter 84 will provide a larger or smaller signal to the input of summing junction 90 so as to raise or lower the heat applied to the melt material.

Various modifications can be made to the apparatus just described. For example, as shown in FIG. 5, the lens 52 can be replaced by a coherent optical fiber bundle 100, whereby each fiber of the bundle transmits the amount of radiation received at one end of its other end. The latter end of each optical fiber of the bundle is preferably positioned adjacent a corresponding one of the detectors 54. Further, it will be appreciated that although maximum contrast is achieved by observing the solid/liquid/vapor junction at an angle perpendicular to the surface of the meniscus at the junction, the angle can vary from the perpendicular so long as a discernable contrast arising from the reflected radiation from the meniscus and body surfaces exists.

It has been found through experience that the above-described apparatus is not always suitable in adequately controlling the meniscus height, and more particularly crystal growth control. For example, in some furnaces heat convection currents between the actual object being viewed and the sensing instrument can produce "convection current jitter". The latter produces shifts in the image received by the sensing instrument due to changes in the index of refraction produced by the convection current when, in fact, no shift in the solid/-liquid/vapor junction 38 has occured. Since the reference position, to which the position of junction 38 is compared, is electronically determined, shifts in the image of the junction 38, caused by convection current jitter, introduces errors. In order to correct for convection current jitter, the apparatus shown and described above is modified in accordance with the present invention. Specifically, referring generally to FIG. 1 and more particularly to FIG. 5, means in the form of a reference bar or object 102, is fixed in space (by any suitable means such as bracket 103, which in turn may be secured to a wall of furnace 10) adjacent the solid crystal body 16 near the solid/liquid/vapor junction 38, so that a portion of body 16 (as shown in FIG. 5) or the meniscus 30 is observed by means 50 between the object 102 and the junction 38. The object 102 is made of a material such that the amount of reflected radiation from the object and measured will contrast with the radiation reflected from the surface which is viewed as adjacent the object. As shown in FIG. 5 this adjacent surface is provided by the body 16. In this situation, the difference in contrast between the image of the reference bar 102 and the image of the body 42 at the edge 104 of the reference bar can be used to reference the position of the solid/liquid/vapor junction 38. Any shift in the image of junction 38 due to convection currents will produce an equal shift in the image of the edge 104 of the reference bar 102.

In order to control the relative position of the junction 38 and the edge 104 of the reference bar, the control circuit of FIG. 3 is modified as shown in FIG. 6, wherein the comparator 64 is replaced by the comparator circuit generally indicated at 106. As shown, the video input signal from the sensing unit is applied to the positive inputs of comparator amplifiers 108 and 110 and the negative input of comparator amplifier 112. The negative input of comparators 108 and 110 and the positive input of comparator 112 are provided with threshold level voltages by variable setting potentiometers, generally indicated at 114. Comparators 108, 110 and 112 are of the type which provide an inverted output. For reasons which will be more apparent hereinafter the settings of the threshold level of the amplifiers are such that amplifier 112 will normally provide a positive output so long as the amplitude of the video signal is above a first predetermined voltage, the output of amplifier 108 will be zero or a negative voltage so long as the video signal is above a second predetermined value (greater than the first predetermined value) and the output of amplifier 110 will be zero or at some negative value so long as the video signal is above a third predetermined value (less than the first predetermined value).

The outpts of comparators 108, 110 and 112 are connected to the respective inputs of AND gates 116, 118 and 120, respectively, which operate as video sampling gates. Specifically, the strobe signal $\theta s$ is provided at the input of one-shot 122. The output of the one-shot is applied to a second input of each of the gates 116, 118 and 120. Each pulse $\theta s$ provided to one-shot 122 will produce in turn a pulse to the input of gates 116, 118 and 120. Each gate provides a high output pulse when the input to the gate from the corresponding comparator and the one-shot are both high. The output of gates 116, 118 and 120 are connected, respectively, to the inputs of AND gates 124, 126 and 128, which in turn provide outputs to the respective set inputs of flip-flops 66, 130 and 132. A second input to gate 124 is connected to receive the $\overline{Q}$ output of flip-flop 130. The second input to gate 126 is connected to receive the Q output of flip-flop 66, while the second input to gate 128 is connected to the Q output of flip-flop 130.

The reset inputs of flip-flops 130 and 132 are both adapted to receive the clearing pulse $\theta_B$ from sensing unit 60. The Q output of flip-flop 132 is connected to one input of OR gate 134 with the other input of the OR gate receiving $\theta_B$ and the output of the gate being connected to the reset input of flip-flop 66. Finally, the Q output of flip-flop 66 is connected to the input of AND gate 74.

Referring to FIG. 6 as well as the timing diagram of FIG. 7, the transfer pulse $\theta_A$ jam transfers the value in the scaler 76 from the previous scan into the latch 82, as previously described. Next the clearing pulse $\theta_B$ clears the scaler 76 and directly resets flip-flops 130 and 132 and resets flip-flop 66 through OR gate 134. The Q outputs of the flip-flops are all thus low and the $\overline{Q}$ outputs are high. With the $\overline{Q}$ output of flip-flop 130 high, the AND gate 124 is thus provided with one high input. The low Q output of flip-flop 130 is applied to the input of AND gate 128. Finally, with the Q output of flip-flop 66 low, the AND gate 74 will be disabled. The video output of sensing unit 60 as well as the strobe signal $\theta s$ is then provided to the comparator circuit 106. The image of the reference bar 102 will be relatively darker than the image of the solid crystal.

Accordingly, the threshold settings of comparators 108, 110 and 112 are set so that the threshold levels of all three are below the amplitude of the portion of the video signal representative of the reference bar 102 and above the amplitude of the portion of the video signal representative of the solid crystalline body 16.

Thus, as shown in the timing diagram, when the amplitude of the portion of the video signal representative of the reference bar is above the threshold levels of the comparators 108, 110 and 112, the outputs of the comparators 108 and 110 will be zero or negative and the output of comparator 112 will be positive and thus strobed through gate 120 to the input of AND gate 128. However, since the other input to AND gate 128 from the Q output of flip-flop 130 is low, the gate 128 remains disabled and flip-flop 132 remains clear.

As the amount of reflected radiation received increases at t1, indicating the edge 104 of the reference bar 102, the amplitude of the video signal begins to decrease. During this transition at t2 the voltage level of the video signal first falls below the threshold level of the comparator 108. This causes the output of the comparator 108 to go positive. This is strobed through gate 116 to an input of AND gate 124. Since the other input of gate 124 from the $\overline{Q}$ output of flip-flop 130 is high, the gate 124 is enabled and the positive-going transition of the output of the gate 124 sets flip-flop 66. The Q output of flip-flop 66 thus goes high enabling AND gate 74 so that scaler 76 can begin counting the strobe pulses $\theta s$. In this way the scaler begins counting from the edge 104 of the bar 102. Simultaneously, the high output from flip-flop 66 is provided to an input of AND gate 126.

At t3, the amplitude of the video signal falls below the threshold level of comparator 112, causing the output of the comparator to go low (a zero or negative voltage) whereby both inputs to AND gate 128 are now low.

Finally, at t4 the amplitude of the video signal falls below the threshold level of the comparator 110 so that the output of the latter goes positive. AND gate 126 is thus enabled setting flip-flop 130. The Q output of flip-flop 130 goes from low to high, providing a high input to one of the inputs of gate 128. The latter remains disabled since the output of comparator 112 is not low.

The circuit 106 remains in this condition until the portion of the video signal, representing the image on the meniscus, is provided by the sensing unit 60. At this time the amplitude of the video signal increases due to the reduced reflected radiation received by the particular detectors. At t5 the threshold level of comparator 110 is exceeded so that the output of the latter goes low. However, the Q output of flip-flop 130 remains high since a change at its set input will have no effect.

At t6 the threshold level of amplifier 112 is exceeded so that its output goes positive. This enables gate 128 so that the flip-flop 132 is set. By setting the flip-flop 132, a positive going pulse is provided through OR gate 134 to the reset input of flip-flop 66. This causes the Q output of flip-flop 66 to go low and the AND gate 74 to become disabled. The scaler 74 discontinues counting.

Finally, at t7 the threshold level of comparator 108 is exceeded and the output will go to zero or some negative value. This will disable AND gate 124 having no affect on flip-flop 66.

At the end of the scan, the transfer pulse $\theta_A$ is provided, jam transferring to latch 82 the pulse count stored in scaler 76. The remaining aspects of the operation are identical to those previously described with respect to FIGS. 3 and 4.

It will be appreciated that the count in the scaler represents the distance between the edge 104 of the reference bar 102 to the solid/liquid/vapor junction 38 as observed by the detectors 54. When any shift in the junction 38 caused, for example, by convection current jitter, a similar shift in the image of the reference bar will occur and no correction will be provided to the heating elements 18. As such the control of the growth of the crystal is independent of convection current jitter.

Although the invention has been described in connection with controlling the temperature of the melt materials, the crystal growth can also be controlled by adjusting the pulling speed of the crystalline body by mechanism 32. In such a case the thermocouple input to the summing junction of the controller 90 can be eliminated and the output of controller 96 applied to mechanism 32.

Similarly, thermocouple 92 of the FIG. 6 embodiment can be omitted and a manually adjustable voltage source substituted for set point control 94 where the level of voltage of the source required to establish steady growth is empirically determined by prior observation of the meniscus behavior. In such a situation the switch 88 is set to ground, the manually adjustable voltage source 94 is adjusted to provide the desired steady state growth, the amplifier 86 is manually offset to ground level and the switch 88 is then thrown to connect the output of amplifier 86 to the input of the controller 90.

Although the embodiment has been described wherein (1) the reference object 102 is observed above the junction 38 with a portion of body 16 therebetween and (2) the scanning occurs in a downward direction, it will be appreciated that (a) the object 102 can be observed below the junction 38 with a portion of meniscus 30 therebetween and (b) the scanning can occur in an upward direction.

It will be appreciated that a single control device can be provided to control all of the heaters. Alternatively, a separate control unit can be provided for controlling each heater or a group of heaters in order to provide a more uniform distribution of heat to the melt material 14. Further, although the preferred embodiment of the invention has been described with reference to the use of detectors 54 which sense the radiation received by each at the same time and the unit 60 which includes an analog shift register for storing the signals so that they can be sequentially scanned, alternatively, each of the detectors can be sequentially energized to provide a series of analog signal pulses each representative of the output of the respective detector so as to eliminate the need for an analog shift register. As a further modification a single detector could be used together with a scanning mirror. By moving the mirror through preselected positions so as to reflect radiation from the preselected points on at least the surfaces of the crystal body and meniscus adjacent the junction to the detector as well as the reference object and synchronizing the movement of the mirror with the output of the detector, a similar sequence of analog pulses can be provided. Alternatively, a single detector can be positioned to straddle the image of the interface and the reference object to provide an analog signal, the value of which is dependent on the position of the solid/liquid interface relative to the reference object. As the relative position of the interface changes, a corresponding change occurs in the output of the detector.

The invention thus described has several advantages. The growth of a crystalline body, notably a silicon body, can be monitored and controlled simply and easily, so that the cross-sectional dimensions of the growing body are within prescribed limits regardless of whether convection currents are present in the furnace or not. By observing the growth of the body electronically, and utilizing automatic controls to control the speed of pulling of the crystal or the temperature of the melt material, the control is not dependent upon human observation and thus is not subject to human errors which can arise from the psychologically stressful nature of optically observing the meniscus with the human eye as taught by LaBelle in U.S. Pat. No. 3,870,477. By observing the crystalline body and meniscus along the perpendicular to the meniscus surface where it intersects at the solid/liquid/vapor junction when the crystal is being grown under steady state conditions, maximum contrast can be achieved between the body and the meniscus. Further, this portion of the meniscus is substantially more stable and reliable than the center portion of the meniscus, thus providing advantages over the monitoring techniques such as described by Dohmen et al U.S. Pat. No. 3,291,650. The invention also may be used to grow crystals from a melt by techniques other than that described by U.S. Pat. Nos. 3,591,348 and 3,471,266.

What is claimed is:

1. A method of growing a crystalline body of selected material from a growth pool of melt so that said body has a selected cross-sectional shape for some preselected distance along its length, said growth pool being characterized by a meniscus which joins said body at said growth pool said method comprising:

positioning reference object means adjacent the junction where said meniscus meets said body;

observing said body, said reference object means and said meniscus along an optical axis which is substantially perpendicular to the surface of said meniscus where said meniscus meets said body and in which the reference object means appears spaced from the junction with a portion of said meniscus or said body spaced therebetween;

determining a first spatial position where a sharp contrast occurs between said body, and said meniscus and a second spatial position where a sharp contrast occurs between said portion of meniscus or body and said reference object means;

referencing said first spatial position relative to said second spatial position; and controlling the speed at which said body is pulled from said growth pool or the temperature of said growth pool so that said first spatial position can be controlled relative to said second spatial position.

2. A method in accordance with claim 1, wherein said material is silicon and said optical axis is approximately 11° with respect to the horizontal.

3. A method in accordance with claim 1, wherein said material is germanium and said optical axis is approximately 8° with respect to the horizontal.

* * * * *